United States Patent
Tamai et al.

(10) Patent No.: US 6,564,453 B2
(45) Date of Patent: May 20, 2003

(54) BENT WIRE FORMING METHOD

(75) Inventors: Hideaki Tamai, Tokorozawa (JP); Yasuyuki Komachi, Akishima (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 57 days.

(21) Appl. No.: 09/814,189

(22) Filed: Mar. 21, 2001

(65) Prior Publication Data
US 2001/0023534 A1 Sep. 27, 2001

(30) Foreign Application Priority Data
Mar. 24, 2000 (JP) ........................................ 2000-084863

(51) Int. Cl.$^7$ ............................................... H01R 9/00
(52) U.S. Cl. ............................ 29/843; 29/842; 29/844; 29/860
(58) Field of Search .......................... 29/842, 843, 844, 29/840, 860

(56) References Cited

U.S. PATENT DOCUMENTS

| | | | |
|---|---|---|---|
| 5,734,546 A | * | 3/1998 | Kuriyama et al. .......... 29/25.03 |
| 5,813,115 A | * | 9/1998 | Misawa et al. ......... 228/180.22 |
| 5,917,707 A | * | 6/1999 | Khandros et al. ......... 228/179.1 |
| 5,926,951 A | * | 7/1999 | Khandros et al. ........... 174/261 |
| 6,049,976 A | * | 4/2000 | Khandros ................ 228/180.5 |

FOREIGN PATENT DOCUMENTS

JP    H11-514493    12/1999

* cited by examiner

Primary Examiner—Timothy V. Eley
Assistant Examiner—Alvin J. Grant
(74) Attorney, Agent, or Firm—Koda & Androlia

(57) ABSTRACT

So as to obtain a pin-form wire having a stable high-quality shape without being affected by the back tension in a bonding wire, a capillary of the bonding apparatus, with the formed pin-form wire inside the capillary, is move along a curved path has a shape of a bent wire to be formed after forming the pin-form wire by a wire bonding apparatus.

7 Claims, 4 Drawing Sheets

BENT WIRE FORMING METHOD

BACKGROUND OF THE INVENTION

1. Field of the Invention

The present invention relates to a bent wire forming method.

2. Prior Art

Japanese Patent Application Internal Publication No. H11-514493 discloses a conventional example of a method for forming a bent wire that has a bent portion by means of a wire bonding apparatus. In this method, a ball is formed on the tip end of a wire that passes through a capillary and caused to extend from the undersurface of the capillary, and the capillary is lowered so that the ball is bonded to an electrode pad. Then, the capillary is moved along a curved path, thus forming a bent wire shape. Further, the capillary is raised from a wire cutting position, and a bent wire is finally formed by cutting the wire by means of an electronic flame jet or by using a mechanical means such as a knife.

Generally in a wire bonding apparatus, a back tension is applied to the wire that passes through the capillary so that a constant tension is applied to the wire. In addition, a wire clamper is installed above the capillary in order to hold the wire.

In the above-described prior art, the wire is cut after the bent wire shape has been formed by moving the capillary. As a result, it has several problems. When the bent wire shape is formed by the moving capillary, it is necessary to pay out the wire from the capillary; accordingly, the wire clamper is in an open state. As a result, the bent wire shape that exists prior to cutting is pulled upward and deformed by the back tension that is applied to the wire. Thus, a stable shape cannot be obtained. Furthermore, a bent wire shape is formed simply by moving the capillary along the bent wire shape that is to be formed. Accordingly, the shapes of the bent portion and inclined portion of the bent wire are deformed by the elastic force of the wire. This also makes it impossible to obtain a stable shape.

BRIEF SUMMARY OF THE INVENTION

Accordingly, the first object of the present invention is to provide a bent wire forming method which produces a wire with a stable high-quality shape without this shape being affected by the back tension that is applied to the wire.

The second object of the present invention is to provide a bent wire forming method in which the excess elastic force of the wire is absorbed so that a constant amount of elastic force is obtained, thus forming an even more stable high-quality shape.

The third object of the present invention is to provide a method for forming a bent wire with a stable, constant length, in which the wire length above the ball that is bonded to an electronic circuit element, etc. can be set as desired, so that the method involves no increase in cost, and the length of the pin-form wire can be consistent.

The above-described first object is further accomplished by unique steps of the present invention for a bent wire forming method, and the unique steps of the present invention comprises: forming a pin-form wire by means of a wire bonding apparatus; moving a capillary of the wire bonding apparatus along a curved path with the pin-form wire inserted in the capillary and with a wire separated from the pin-form wire inside the capillary.

The above-described first object is accomplished by unique steps of the present invention for a bent wire forming method, and the unique steps comprises: forming a pin-form wire by means of a wire bonding apparatus; and moving a capillary of the wire bonding apparatus along a curved path with the pin-form wire inside the capillary.

The above-described first object is still further accomplished by unique steps of the present invention for a bent wire forming method, and the unique steps of the present invention comprises: forming a pin-form wire by means of a wire bonding apparatus; allowing the pin-form wire to be entered into an empty capillary and moving the capillary along a curved path.

Furthermore, the above-described pin-form wire is formed by the steps of: forming a ball on a tip end of a wire that passes through the capillary; allowing the wire to extend from a lower end of the capillary; forming a notch in a portion of the wire located between the ball and the capillary using a notching means that is installed in the wire bonding apparatus; bonding the ball to an electrode pad of an electronic circuit element by the capillary; raising the capillary; and pulling the wire upward to cut the wire at the notch.

In addition, in the present invention, the pin-form wire can be formed by a wire bonding apparatus that includes a first wire clamper that is movable in a vertical direction along with the capillary and a second wire clamper that is immovable in a vertical direction; and with this boding apparatus, the pin-form wire is formed by the steps of:

forming a ball on a tip end of a wire passing through the second wire clamper, first wire clamper and capillary, the second wire clamper being opened and the first wire clamper being closed;

opening the first wire clamper so as to render the ball to contact a lower end of the capillary as a result of an action of a back tension applied to the wire;

lowering the capillary and first wire clamper;

raising the capillary and first wire clamper after closing the second wire clamper so as to cause the wire to extend from the lower end of the capillary;

closing the first wire clamper and opening the second wire clamper, then forming a notch in a portion of the wire located between the ball and the capillary using a notching means of the wire bonding apparatus;

opening the first wire clamper and lowering the capillary and first wire clamper so as to bond the ball to an electrode pad of an electronic circuit element by the capillary; and raising the capillary and first wire clamper and closing the first wire clamper at an intermediate point during the raising movement of the capillary and first wire clamper, thus pulling the wire upward and cutting the wire at the notch.

DETAILED DESCRIPTION OF THE INVENTION

One embodiment of the present invention will be described with reference to FIGS. 1 and 2.

Figure 1:
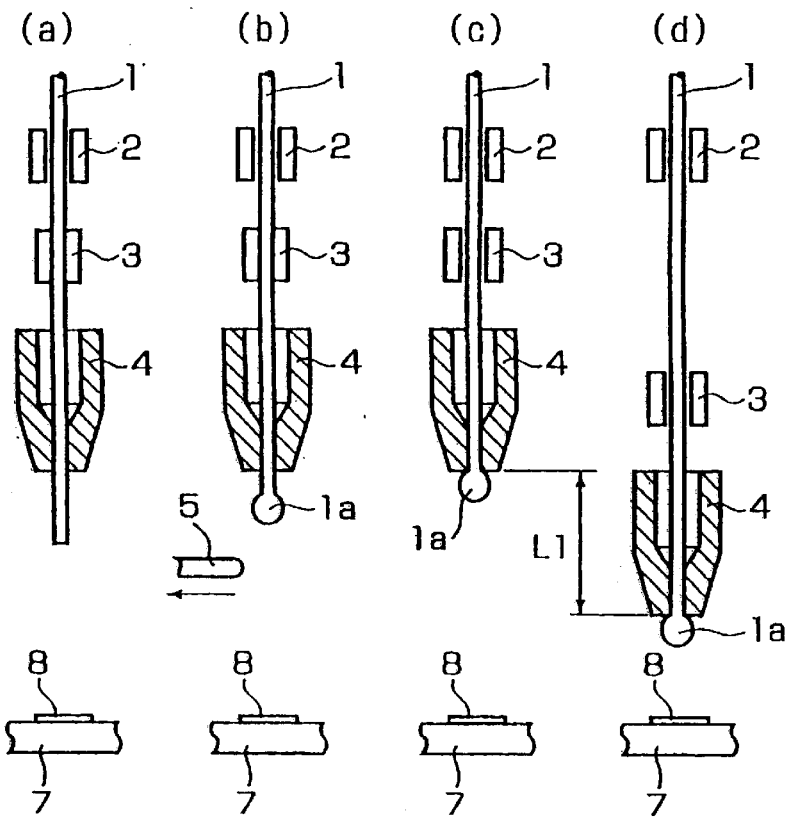
FIGS. 1(a) through 1(h) show the steps of forming a pin-form wire according to one embodiment of the bent wire forming method of the present invention.
Figure 1:
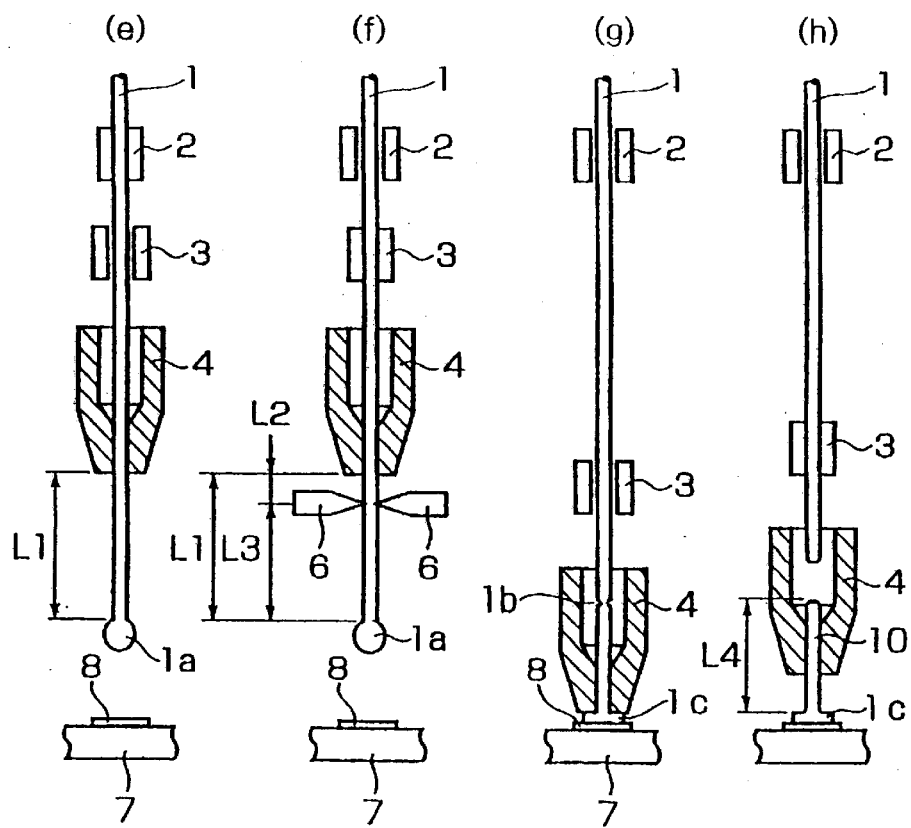

As seen from FIG. 1, in step (a), a wire 1 is brought to pass through a capillary 4 via a second wire clamper 2 and a first wire clamper 3. The wire 1 extends from the lower end of the capillary 4. In this state, the second wire clamper 2 is opened, and the first wire clamper 3 is closed. The second wire clamper 2 is installed so as not to move upward or downward. The first wire clamper 3 is movable upward and downward together with the capillary 4.

In step (b), a ball 1a is formed on the tip end of the wire 1 by a discharge from an electric torch 5. Afterward, the electric torch 5 is moved in the direction indicated by the arrow.

Next, in step (c), the first wire clamper 3 is opened. As a result, the ball 1a is caused to contact the lower end of the capillary 4 by the action of the back tension that is applied to the wire 1.

In step (d), the capillary 4 and first wire clamper 3 are lowered by a distance L1. Then, in step (e), the second wire clamper 2 is closed, and the capillary 4 and first wire clamper 3 are raised to their original positions. In other words, they are raised by the distance L1. As a result, the wire 1 extends from the lower end of the capillary 4 by a distance L1.

Next, in step (f), the first wire clamper 3 is closed and the second wire clamper 2 is opened, after which cutters 6 perform a reciprocating action to form notches 1b at the location where the wire 1 is to be cut. The cutters 6 are installed in a wire bonding apparatus (not shown), and they are located beneath the lower end of the capillary 4 at a distance L2 from the lower end of the capillary 4. When forming the notches, the cutters 6 contact the wire 1 from opposite directions and bite into the wire 1 more or less equally. Thus, the notches 1b are formed with a more or less equal size in opposite positions.

After making the notches 1b, the cutters 6 are retracted. After this, in step (g), the first wire clamper 3 is opened and the capillary 4 and first wire clamper 3 are lowered so that the ball 1a is pressed against the electrode pad 8 of an electronic circuit element 7, such as an IC, LSI, etc. Then, an ultrasonic vibration is applied to the capillary 4. As a result, the ball a is bonded to the electrode pad 8, thus converting the ball 1a into a press-bonded ball 1c.

Next, in step (h), the capillary 4 and first wire clamper 3 are both raised; and during this upward movement of the capillary 4 and first wire clamper 3, the first wire clamper 3 is closed at the intermediate point of the upward movement. As a result, the wire 1 is cut at the notches 1b, so that a pin-form wire 10 is formed. In the above process, the timing at which the first wire clamper 3 is closed is that the capillary 4 is brought, with the pin-form wire 10 inside the capillary 4, to the starting position of the bend-wire formation process (see step (g) of FIG. 2). The notches 1b are formed with an equal size in opposite positions on the wire 1. Accordingly, the cut surface is uniform and has no variations. In addition, the length of the pin-form wire 10 is stable, and a fixed length L4 is obtained.

Next, the method for forming a bent wire 11 will be described with reference to FIG. 2. In the steps (a) through (f) in FIG. 2, the second wire clamper 2 is not shown.

Figure 2:
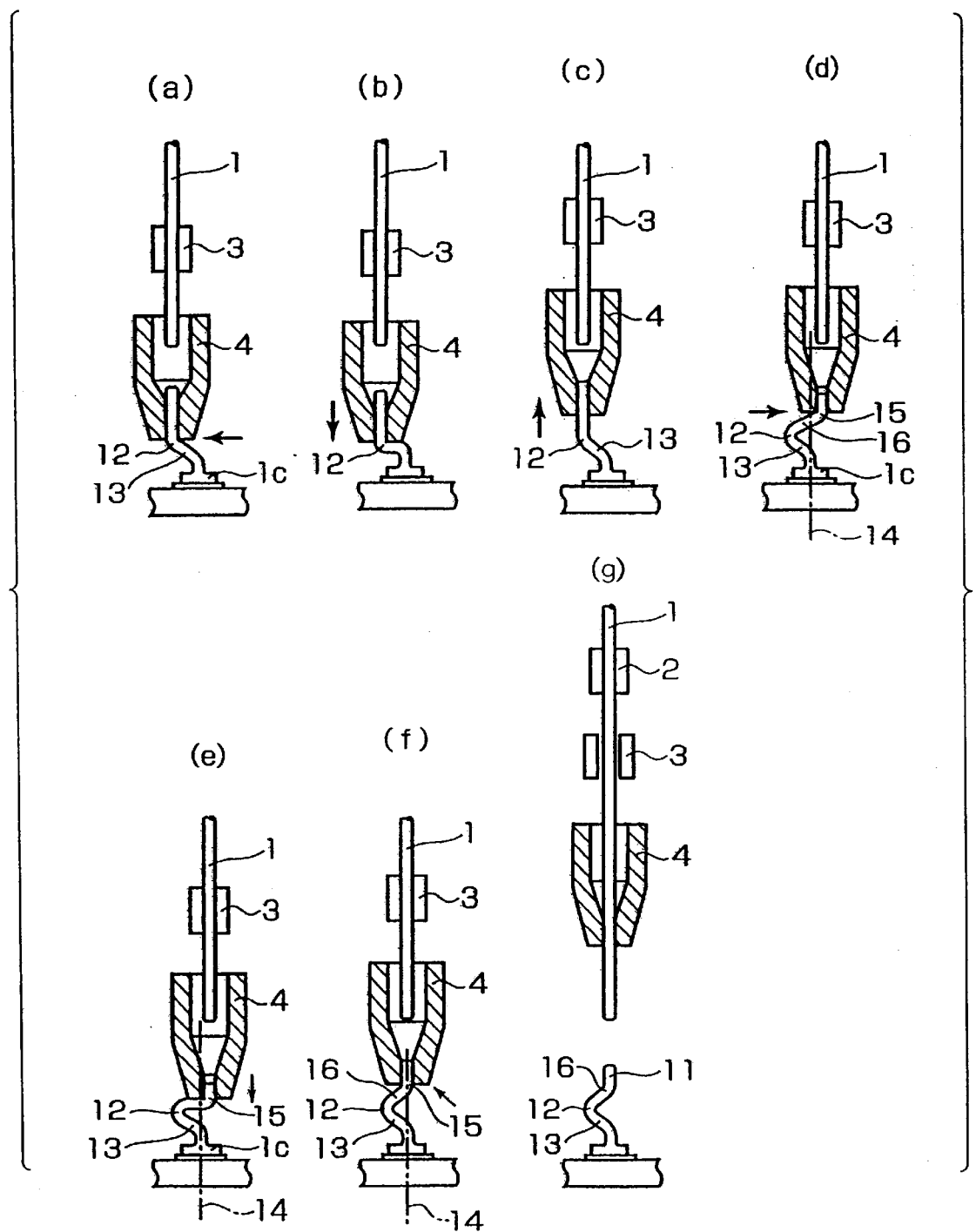
FIGS. 2(a) through 2(g), a continuation of FIGS. 1(a) through 1(h), show the steps of forming the bent wire.

From the location of step (h) of FIG. 1, the capillary 4 and first wire clamper 3 are moved horizontally in step (a) of FIG. 2. As a result, a kink is created in a first bent portion 12 which contacts the lower end of the capillary 4; and a first inclined portion 13 is formed between the press-bonded ball 1c and the first bent portion 12.

Next, in step (b) of FIG. 2, the capillary 4 and first wire clamper 3 are lowered slightly (by approximately 100 μm). As a result, the first inclined portion 13 is pushed down by the undersurface of the capillary 4.

In step (c), the capillary 4 and first wire clamper 3 are raised.

Here, if the step (c) of FIG. 2 is performed immediately following the step (a) without performing the step (b), then the angle of inclination (shape) of the first inclined portion 13 will vary according to the elasticity of the first inclined portion 13. As a result of the step (b) performed between step (a) and step (c) as in this embodiment, the elastic deformation of the first inclined portion 13 is absorbed. Accordingly, the angle of inclination (shape) of the first inclined portion 13 is stabilized when the capillary 4 is raised in step (c).

Next, as seen from step (d), the capillary 4 and first wire clamper 3 are moved horizontally to a point slightly beyond the centerline 14 of the press-bonded ball 1c (by approximately 100 μm) in the opposite direction from the direction of movement between step (h) of FIG. 1 and step (a) of FIG. 2. As a result, a kink is created in the second bent portion 15 that contacts the lower end of the capillary 4, so that a second inclined portion 16 which is oriented in the opposite direction from the first inclined portion 13 is formed from the first bent portion 12 to the second bent portion 15.

Then, in step (e), the capillary 4 and first wire clamper 3 are lowered slightly (by approximately 100 μm). As a result, the second inclined portion 16 is pushed downward by the undersurface of the capillary 4.

In step (f), the capillary 4 is raised at an inclination to the centerline 14 of the press-bonded ball 1c. As a result of step (e) of FIG. 2, the angle of inclination (shape) of the second inclined portion 16 is stable in the same manner as in step (b) of FIG. 2.

Next, in step (g), the second wire clamper 2 is closed, the first wire clamper 3 is opened, and the capillary 4 and first wire clamper 3 are raised. As a result, the wire 1 extends from the lower end of the capillary 4. After this, the second wire clamper 2 is opened, and the first wire clamper 3 is closed. As a result, a bent wire 11 is formed. The capillary 4 is then moved to a point above the next electrode pad 8, resulting in the state of step (a) of FIG. 2.

Afterward, bent wires 11 are successively formed by performing the steps (a) through (h) of FIG. 1 and steps (a) through (g) of FIG. 2.

As seen from the above, in the shown embodiment, the pin-form wire 10 cut from the wire 1 is first formed in step (h) of FIG. 1, and then this pin-form wire 10 is formed into a bent wire 11 by the processes of steps (a) through (g) of FIG. 2. Accordingly, the back tension applied to the wire 1 beforehand has absolutely no effect during the formation of the bent wire 11, and no deformation occurs in the formed bent wire 11. Furthermore, when the first inclined portion 13 and second inclined portion 16 are formed, a bent wire 11 that is even more stable is obtained as a result of performing processes in which the capillary 4 is slightly lowered so that the wire 1 is pushed downward in steps (b) and (e) of FIG. 2.

Furthermore, when the pin-form wire 10 is formed, the step of fonuing the notches 1b in the wire 1 by the cutters 6 (step (f) of FIG. 1) is performed before the capillary 4 is lowered in order to bond the ball 1a to the electrode pad 8. Accordingly, there is a su.flieient space to provide the cutters 6 between the electrode pad S and capillary 4, and there is no interference. Furthermore, even in cases where bent wires 11 (shown in step (g) of FIG. 2) have afready been formed in a densely concentrated maimer, since the cutters 6 are operated above the bent wires 11 in a position away from the bent wires 11. Accordingly, the cutters 6 do not contact the bent wires 11. As a result of these features, there are no restrictions on the portion of the wire 1 in which the notches 1b are formed, and the length L3 of the pin-form wire 10 can be set as desired.

In addition, with the use of the second wire clamper 2, the wire 1 can be extended by a fixed length of L1 from the lower end of the capillary 4 (see step (e) of FIG. 1). Accordingly, the notches 1b can be formed in positions that correspond to a predetermined wire length L3 shown in step (1) of FIG. 1. Accordingly, the length of the formed pin-form wire 10 is constant, and a fixed length L4 that is more or less equal to the length L3 can be obtained.

Figure 3:
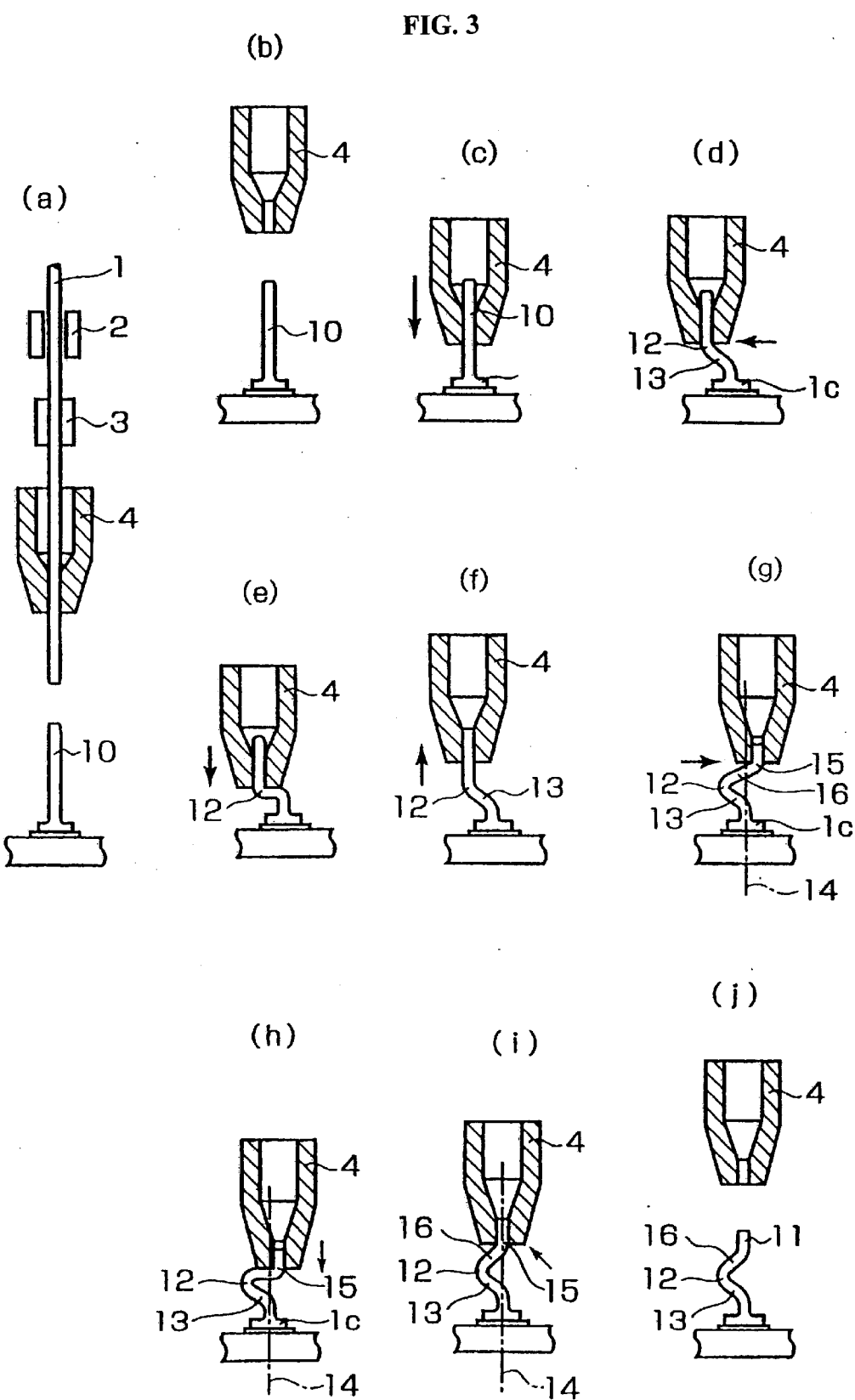
FIG. 3 shows the steps taken in another embodiment of the bent wire forming method of the present invention.

FIG. 3 shows another embodiment of the present invention.

In the previous embodiment, the bent wire 11 is formed by a series of steps using a wire bonding apparatus. In the embodiment of FIG. 3, a pin-form wire 10 is formed beforehand by means of a wire bonding apparatus, and then a bent wire 11 is formed by steps using an empty capillary 4 (in other words, a capillary 4 with no wire 1 therein) of the wire bonding apparatus.

The pin-form wire 10 is formed by steps (a) through (g) of FIG. 1 and step (a) of FIG. 3. In other words, step (h) of FIG. 1 is replaced with step (a) of FIG. 3. Accordingly, the description of steps (a) through (g) of FIG. 1 will be omitted, and the description will begin at the state wherein the step (g) of FIG. 1 has been completed.

As described before, in step (g) of FIG. 1, the ball 1a is bonded to the electrode pad 8, and the ball 1a is thus changed into a press-bonded ball 1c.

Next, the capillary 4 is raised together with the first wire clamper 3 to a point above the notches 1b. The first wire clamper 3 is closed at an intermediate point during this upward movement of the capillary 4 and first wire clamper 3. As a result, the wire 1 is cut in the area of the notches 1b, and the pin-form wire 10 is formed. Also, the wire 1 extends from the undersurface of the capillary 4 in step (a) of FIG. 3. Pin-form wires 10 are successively formed by steps (a) through (g) of FIG. 1 and step (a) of FIG. 3.

Next, the bent wire 11 is formed by steps (b) through (j) of FIG. 3. Steps (d) through (j) of FIG. 3 respectively correspond to steps (a) through (g) of FIG. 2 in the previous embodiment. In steps (a) through (g) of FIG. 2, the lower portion of the wire 1 is positioned inside the capillary 4. However, in steps (d) through (j) of the embodiment shown in FIG. 3, the wire 1 is not present inside the capillary 4.

More specifically, in step (b) of FIG. 3, the empty capillary 4 is positioned above the pin-form wire 10. Then, the capillary 4 is lowered in step (c), so that the pin-form wire 10 enters the capillary 4.

Next, in step (d), the capillary 4 is moved in the horizontal direction as indicated by the arrow, so that a kink is created in the first bent portion 12 contacting the lower end of the capillary 4. Thus, a first inclined portion 13 is formed between the press-bonded ball 1c and the first bent portion 12. Then, the capillary 4 is lowered slightly (by approximately 100 μm) in step (e). As a result, the first inclined portion 13 is pushed downward by the undersurface of the capillary 4.

The capillary 4 is raised in next step (f).

Furthermore, in step (g), the capillary 4 is moved as indicated by the arrow to a point that is slightly beyond (i.e., approximately 100 μm beyond) the centerline 14 of the press-bonded ball 1c in the horizontal direction, which is the opposite direction from the above-described horizontal direction in step (d). As a result, a kink is created in the second bent portion 15 that is in contact with the lower end of the capillary 4, and a second inclined portion 16 oriented in the opposite direction from the first inclined portion 13 is formed between the first bent portion 12 and the second bent portion 15.

Next, in step (h), the capillary 4 is lowered slightly (approximately 100 μm). As a result, the second inclined portion 16 is pushed downward by the undersurface of the capillary 4. Then, in step (i), the capillary 4 is raised obliquely as indicated by the arrow to a point on the centerline 14 of the press-bonded ball 1c.

In step (j), the capillary 4 is raised, thus finishing the bent wire 11. Afterward, bent wires 11 are successively formed from the pin-form wires 10 by performing the steps (b) through (j) of FIG. 3.

In this embodiment, as in the previous embodiment, the pin-form wire 10 which is cut from the wire 1 is first formed in step (a) of FIG. 3, and the bent wire 11 is formed from this pin-form wire 10 by the steps (b) through (j). Accordingly, the back tension applied to the wire I has absolutely no effect during the formation of the bent wire 11, and there is no deformation in the formed bent wire 11. Furthermore, when the first inclined portion 13 and second inclined portion 16 of the bent wire ii are formed, the capillary 4 is slightly lowered in steps (e) and (h) so that the pin-form wire 10 is pushed downward. As a result, the bent wire 11 that is even more stable is obtained.

In the embodiment shown in FIGS. 1 and 2, since the bent wire 11 is formed by a series of steps, it is necessary for forming notches 1b in a predetermined cutting position as shown in step (f) of FIG. 1. However, in the embodiment shown in FIG. 3, the pin-form wire 10 is formed, and then the bent wire 11 is formed using an empty capillary 4. Accordingly, the method for forming the pin-form wire 10 is not limited to the above-described steps (a) through (g) of FIG. 1 and the step (a) of FIG. 3. For example, it is possible to form the pin-form wire 10 by the method shown in FIG. 4.

Figure 4:
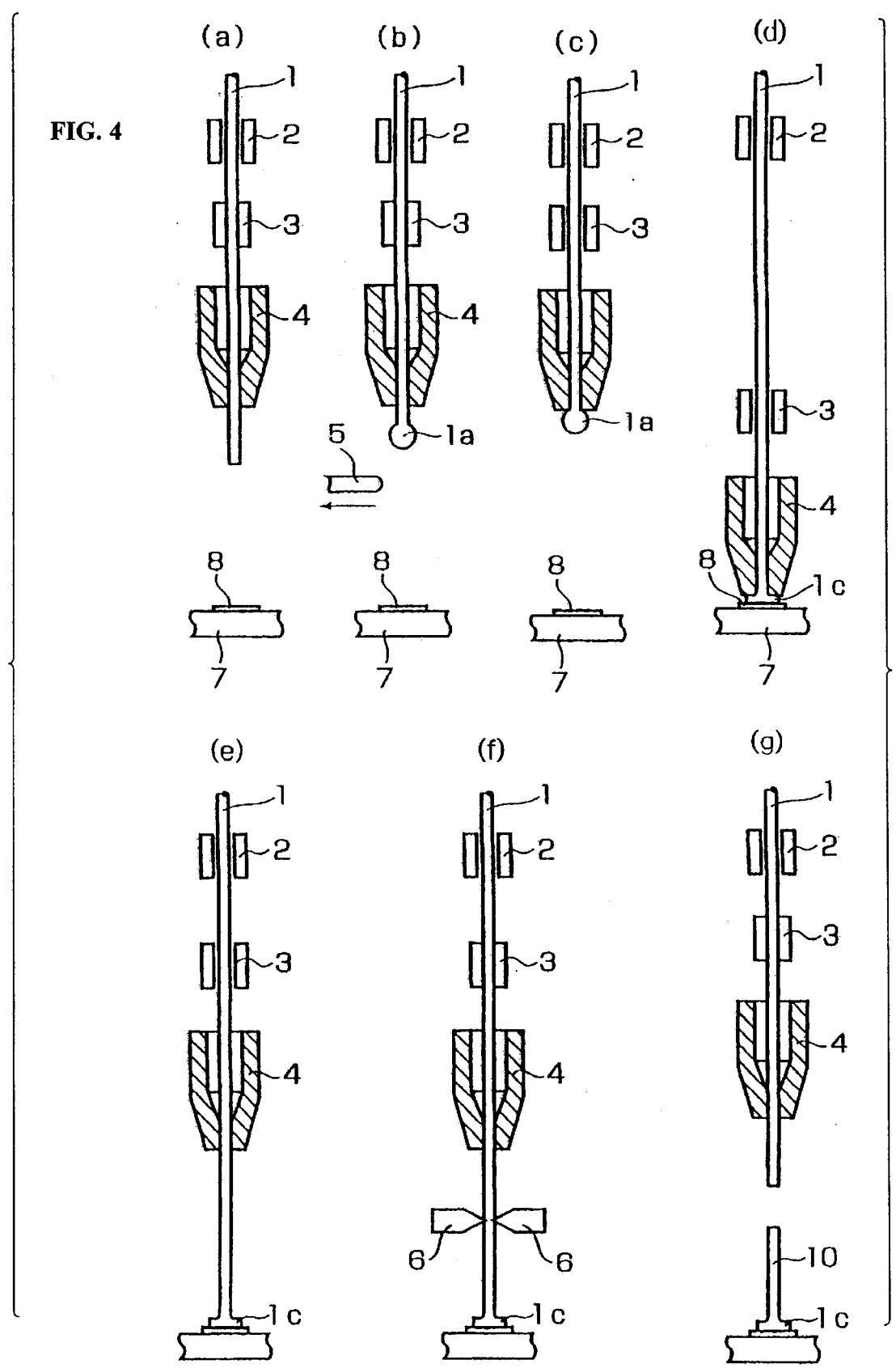
FIG. 4 shows the steps of forming pin-form wire by still another embodiment of the present invention.

In the method of FIG. 4, a wire 1 is set to pass through the capillary 4 via a second wire clamper 2 and a first wire clamper 3 and is caused to extend from the lower end of the capillary 4 in step (a). In this state, the second wire clamper 2 is opened, and the first wire clamper 3 is closed. In next step (b), a ball 1a is formed on the tip end of the wire 1 by a discharge from an electric torch 5. Afterward, the electric torch 5 is moved in the direction indicated by the arrow.

Next in step (c), the first wire clamper 3 is opened. As a result, the ball 1a is caused to contact the lower end of the capillary 4 by the action of the back tension applied to the wire 1. Then, the capillary 4 and first wire clamper 3 are lowered in step (d) so that the ball 1a is pressed against the electrode pad 8 of an electronic circuit element 7 such as an IC and LSI. Next, an ultrasonic vibration is applied to the capillary 4, so that the ball 1a is bonded to the electrode pad 8, thus converting the ball 1a into a press-bonded ball 1c.

In the following step (e), the capillary 4 and first wire clamper 3 are raised by an amount equal to the length of a pin-form wire 10 and the tail length. Then, in step (f), after the first wire clamper 3 is closed, the cutters 6 perform a reciprocating motion and cut the wire 1. After this, in step (g), the cutters 6 are retracted, and the capillary 4 and the first wire clamper 3 are raised. The pin-form wire 10 is thus formed.

As seen from the above, in the present invention, a pin-form wire is formed by means of a wire bonding apparatus, and with the pin-form wire inside a capillary of the bonding apparatus, the capillary is moved so that the movement of the capillary along a curved path bends the pin-form wire, thus forming a bent pin-form wire. Accordingly, a pin-form wire with a stable high-quality shape can be obtained without this shape being affected by the back tension that is applied to the wire.

Furthermore, in the present invention, a pin-form wire is formed by means of a wire bonding apparatus; and with the formed pin-form wire inside the capillary of the wire bonding apparatus and the wire cut from the pin-form wire also inside the capillary, the capillary is moved along a curved path so as to form a bent pin-form wire. Or a pin-form wire is formed by a wire bonding apparatus, the capillary is moved so that the pin-form enters into an empty capillary, and then the capillary is moved along a curved path so as to bend the pin-form wire, thus forming a bent pin-form wire. Accordingly, a pin-form wire with a stable high-quality shape is obtained without this shape being affected by the back tension that is applied to the wire.

In addition, in the present invention, an inclined portion is formed by moving the capillary so that a kink is created in the bent portion of the bent wire, and then the capillary is slightly lowered so that the inclined portion is pushed downward by the capillary. Accordingly, a pin-form wire with a stable high-quality shape is obtained without this shape being affected by the back tension that is applied to the wire; and further, the excess elastic force that is present is absorbed so that a constant elastic force is obtained, thus forming a pin-form wire with an even more stable high-quality shape.

Furthermore, in the present invention, the formation of the pin-form wire is accomplished by: causing the wire that passes through the capillary to extend from the lower end of the capillary after a ball has been formed on the tip end of said wire; forming a notch in the portion of the wire located between the ball and the capillary using a notching means that is installed in the wire bonding apparatus; bonding the ball to the electrode pad of an electronic circuit element, etc. by the capillary; and then pulling the wire upward to cut the wire at the notch after the capillary has been raised. Accordingly, a pin-form wire with a stable high-quality shape can be obtained without this shape being affected by the back tension that is applied to the wire. In addition, the length of the wire above the ball that is bonded to the electronic circuit element, etc. can be set as desired, and no increase in cost occurs. Moreover, the length of the pin-form wire can be constant.

What is claimed is:

1. A bent wire forming method comprising the steps of:
    forming a pin-form wire by means of a wire bonding apparatus; and
    moving a capillary of said wire bonding apparatus along a curved path with said pin-form wire inside said capillary.

2. A bent wire forming method comprising the steps of:
    forming a pin-form wire by means of a wire bonding apparatus;
    moving a capillary of said wire bonding apparatus along a curved path with said pin-form wire inserted in said capillary and with a wire separated from said pin-form wire inside said capillary.

3. A bent wire forming method comprising said steps of:
    forming a pin-form wire by means of a wire bonding apparatus;
    allowing said pin-form wire to be entered into an empty capillary, and
    moving said capillary along a curved path.

4. The bent wire forming method according to claim 1, 2 or 3, wherein said step of moving said capillary comprises the steps of:
    moving said capillary so as to create a kink in said pin-form wire thus forming an inclined portion in said pin-form wire; and
    lowering said capillary slightly so as to push said inclined portion down by said capillary.

5. The bent wire forming method according to claim 1, 2 or 3, wherein said pin-form wire is formed by the steps of:
    forming a ball on a tip end of a wire that passes through said capillary;
    allowing said wire to extend from a lower end of said capillary;
    forming a notch in a portion of said wire located between said ball and said capillary using a notching means that is installed in said wire bonding apparatus;
    bonding said ball to an electronic circuit element by said capillary;
    raising said capillary; and
    pulling said wire upward to cut said wire at said notch.

6. The bent wire forming method according to claim 2 or 3, wherein said pin-form wire is formed using a wire bonding apparatus which is equipped with a first wire clamper that is movable in a vertical direction along with said capillary and a second wire clamper that is immovable in a vertical direction, and said pin-form wire is formed by the steps of:
    forming a ball on a lip end of a wire passing through said second wire clamper, first wire clamper and capillary, said second wire clamper being opened and said first wire clamper being closed;
    opening said first wire clamper so as to render said ball to contact a lower end of said capillary as a result of an action of a back tension applied to said wire;
    lowering said capillary and first wire clamper, raising said capillary and first wire clamper after closing said second wire clamper so as to cause said wire to extend from said lower end of said capillary;
    closing said first wire clamper and opening said second wire clamper, then forming a notch in a portion of said wire located between said ball and said capillary using a notching means installed in said wire bonding apparatus;
    opening said first wire clamper and lowering said capillary and first wire clamper so as to bond said ball to an electrode pad of an electronic circuit element by said capillary; and
    raising said capillary and first wire clamper and closing said first wire clamper at an intermediate point during said raising movement of said capillary and first wire clamper, thus pulling said wire upward and cutting said wire at said notch.

7. A bent wire forming method comprising the steps of:
    forming a pin-form wire by means of a wire bonding apparatus;
    moving a capillary of said wire bonding apparatus along a curved path with said pin-form wire inside said capillary; and wherein
        said pin-form wire is formed using a wire bonding apparatus which is equipped with a first wire clamper that is movable in a vertical direction along with said capillary and a second wire clamper that is movable in a vertical direction, and said pin-form wire is formed by the steps of:

forming a ball on a tip end of a wire passing through said second wire clamper, first wire clamper and capillary, said second wire clamper being opened and said first wire clamper being closed;

opening said first wire clamper so as to render said ball to contact a lower end of said capillary as a result of an action of a back tension applied to said wire;

lowering said capillary and first wire clamper;

raising said capillary and first wire clamper after closing said second wire clamper so as to cause said wire to extend from said lower end of said capillary;

closing said first wire clamper and opening said second wire clamper, then forming a notch in a portion of said wire located between said ball and said capillary using a notching means installed in said wire bonding apparatus, opening said first wire clamper and lowering said capillary and first wire clamper so as to bond said ball to an electrode pad of an electronic circuit element by said capillary and raising said capillary and first wire clamper and closing said first wire clamper at an intermediate point during said raising movement of said capillary and first wire clamper, thus pulling said wire upward and cutting said wire at said notch.

* * * * *